United States Patent [19]

Praeg

[11] 4,305,785
[45] Dec. 15, 1981

[54] SENSOR FOR DETECTING CHANGES IN MAGNETIC FIELDS

[75] Inventor: Walter F. Praeg, Palos Park, Ill.

[73] Assignee: The United States of America as represented by the United States Department of Energy, Washington, D.C.

[21] Appl. No.: 124,871

[22] Filed: Feb. 26, 1980

[51] Int. Cl.³ .................. G01R 33/02; E21B 25/00
[52] U.S. Cl. ........................... 376/143; 324/260; 324/258; 324/244
[58] Field of Search ............ 324/243, 244, 258, 260; 176/3

[56] References Cited

U.S. PATENT DOCUMENTS 3,925,724  12/1975  Steingroever .................. 324/243

Primary Examiner—Gerard R. Strecker
Assistant Examiner—Walter E. Snow
Attorney, Agent, or Firm—James W. Weinberger; Walter L. Rees; Richard G. Besha

[57] ABSTRACT

A sensor for detecting changes in the magnetic field of the equilibrium-field coil of a Tokamak plasma device comprises a pair of bifilar wires disposed circumferentially, one inside and one outside the equilibrium-field coil. Each is shorted at one end. The difference between the voltages detected at the other ends of the bifilar wires provides a measure of changing flux in the equilibrium-field coil. This difference can be used to detect faults in the coil in time to take action to protect the coil.

4 Claims, 4 Drawing Figures

U.S. Patent  Dec. 15, 1981  Sheet 1 of 2  4,305,785
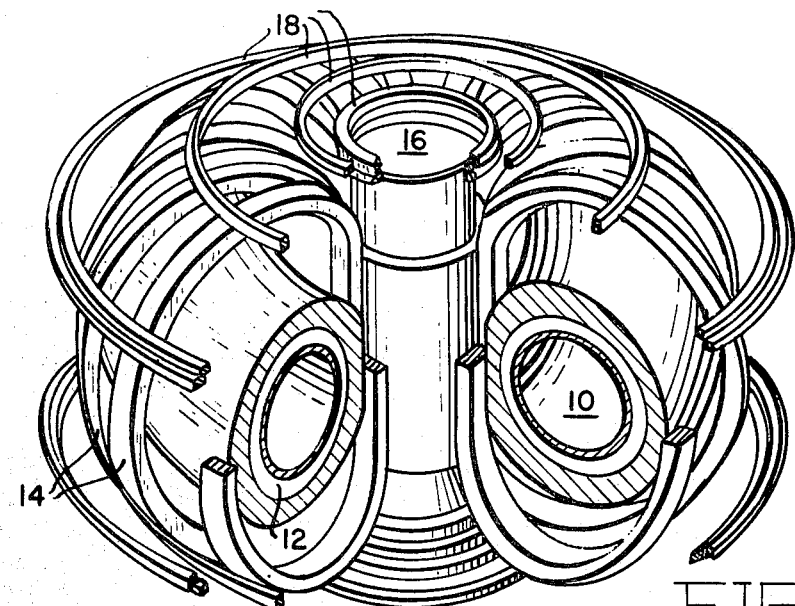
FIG 1
FIG 2
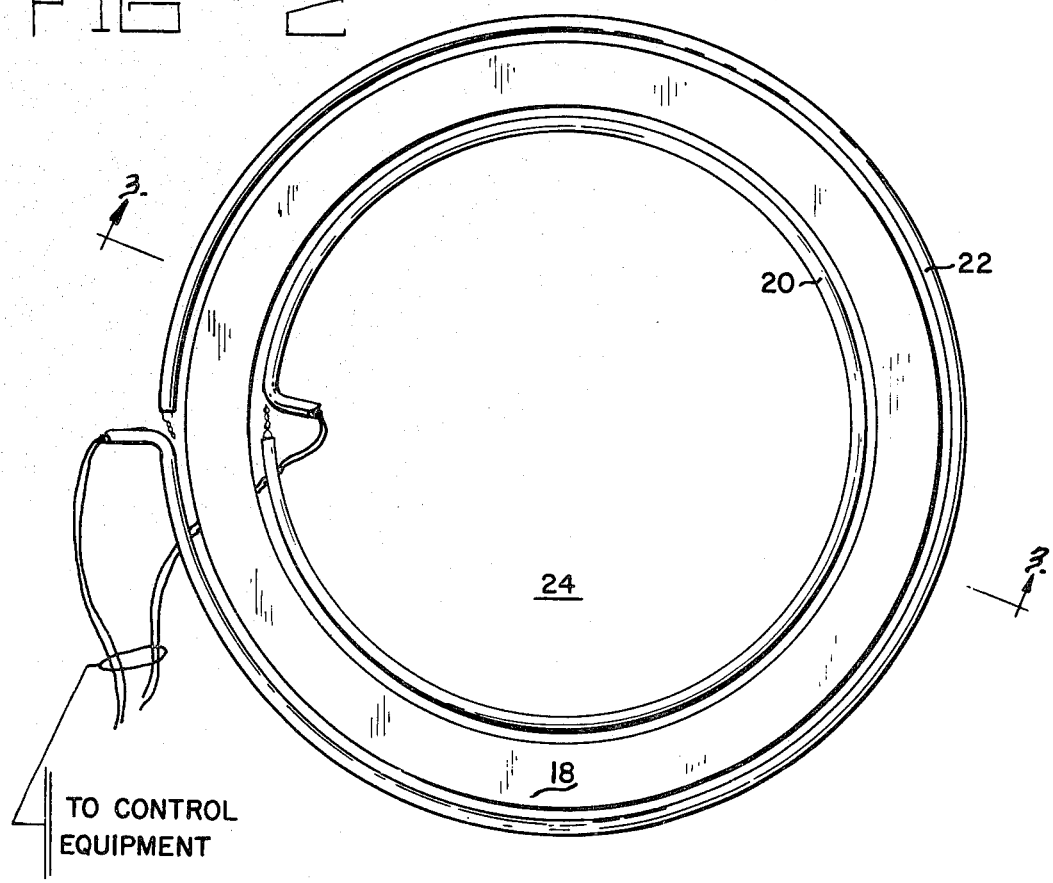
TO CONTROL EQUIPMENT

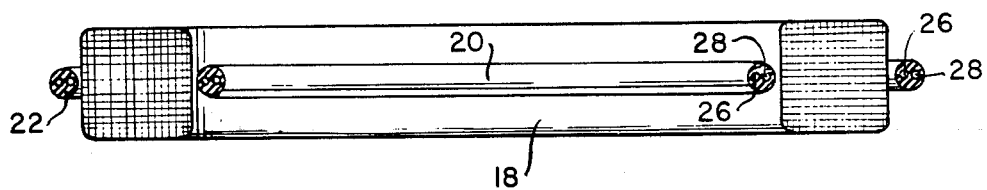
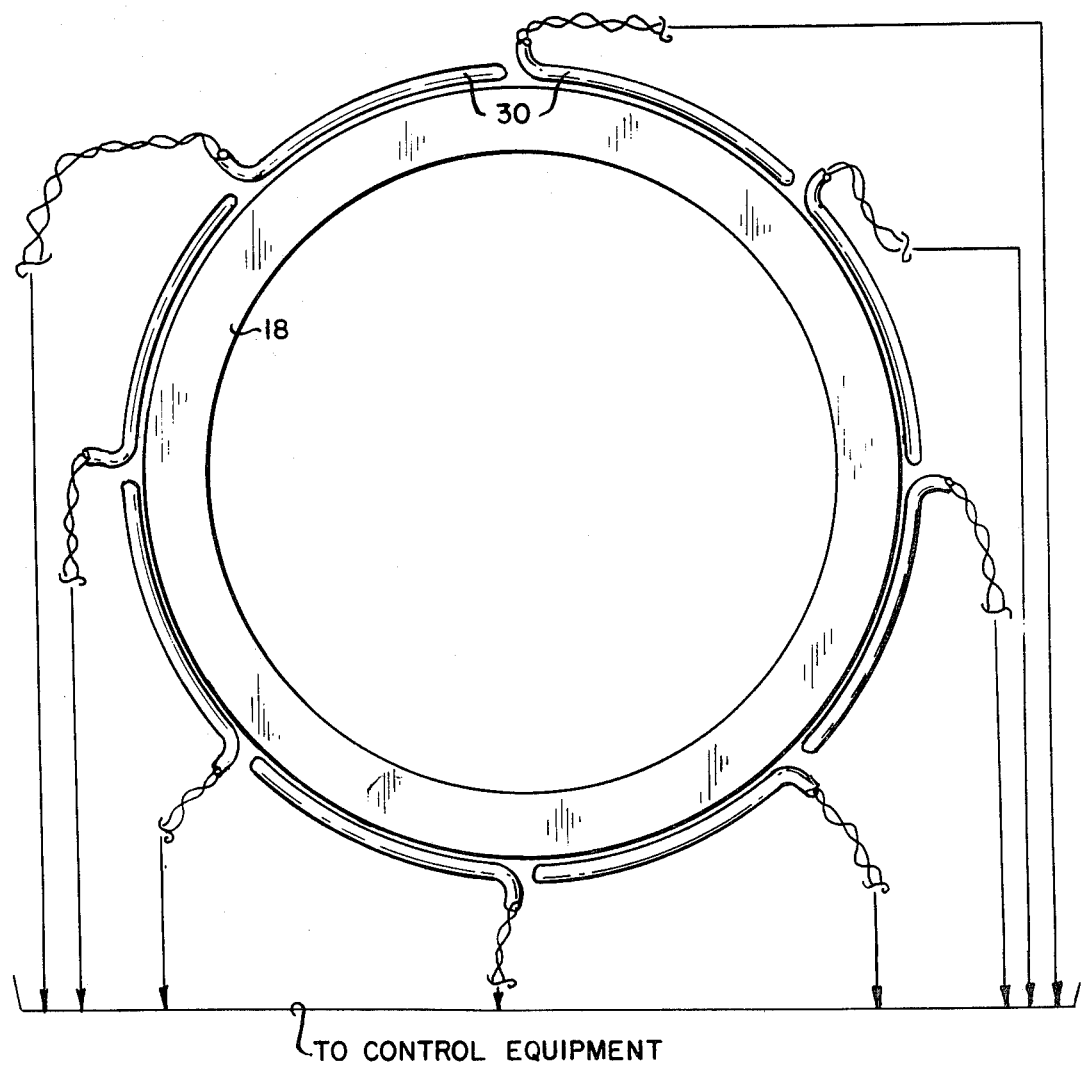
TO CONTROL EQUIPMENT

SENSOR FOR DETECTING CHANGES IN MAGNETIC FIELDS

CONTRACTUAL ORIGIN OF THE INVENTION

The invention described herein was made in the course of, or under, a contract with the UNITED STATES DEPARTMENT OF ENERGY.

BACKGROUND OF THE INVENTION

This invention relates to plasma devices. In particular, it relates to toroidal plasma devices including those referred to as Tokamaks which are toroidal in their design and which include some magnetic coils which are toroidal about the axis of the device.

In order to achieve the design objectives of toroidal plasma devices, it is normally necessary to apply several magnetic fields in several different directions and subject to different types of control. One example of such a device is the Tokamak, a device which generates and confines plasma in a substantially toroidal shape. The combined requirements of confinement and heating lead to the use of several electromagnetic coils to generate particular magnetic fields. One set of coils is wound spirally about the toroidal plasma, enclosing the minor axis of the toroid. This is the so-called toroidal-field coil, referred to here as the TF coil, the main confinement coil of the plasma. It has long been known that a plasma confined only by a TF coil is unstable and that to stabilize such a plasma it is necessary to add one or more coils that are substantially parallel to the midplane of the toroid and coaxial with its major axis. These may be referred to either as poloidal coils or as equilibrium-field coils. They will be referred to here as equilibrium-field (EF) coils. The third type of coil that may be involved in a toroidal plasma is an ohmic-heating (OH) coil that is typically wound to couple by transformer action to the plasma which is then envisioned as a one-turn secondary of the transformer for which the OH coil is the primary. Other systems such as RF induction heating or neutral-beam injection have been proposed to heat toroidal plasmas. Whether or not an OH coil is used, the region in and around the EF coil is one of large magnetic fluxes that in general are varying rapidly over considerable ranges. Fault protection for a toroidal coil such as the EF coil is important to the safe operation of the plasma device and is made more challenging by the presence near that coil of the various magnetic fields. The EF coil is typically carrying large enough amounts of current, of the order of thousands of amperes, so that faults such as shorts from turn to turn or from the coil to a grounded part of the structure can do considerable damage if not interrupted very rapidly. A short from the coil to ground may be detectable in time to minimize further damage by sensing means responsive to the coil current but such a protection would not suffice to guard against damage by shorts from turn to turn of the EF coil.

It is an object of the present invention to provide fault protection for an electromagnet in a toroidal plasma device.

It is a further object of the present invention to provide information about developing electrical faults in an equilibrium-field coil in a toroidal plasma device.

It is a further object of the present invention to provide a sensor of changing magnetic fields that is responsive to changes in the field from one coil in the presence of other changing magnetic fields.

Other objects will become apparent in the course of a detailed description of the invention.

SUMMARY OF THE INVENTION

A sensor to provide information about flux changes in a coil that encloses a region of changing magnetic flux is formed by placing a pair of bifilar windings in the plane of the coil for which flux change is to be sensed. The winding may be inside or outside the coil. The bifilar winding is placed along that coil, one end of the bifilar winding is terminated in a short circuit and each winding is brought out to voltage-measuring equipment at the other end. The bifilar winding limits the response to the flux produced by the coil near which it is disposed and discriminates against changes in magnetic flux enclosed within the inner diameter of the coil. Pairs of bifilar windings may be used to compare differences of voltages, and the windings may be limited to part of the circumference of the coil to make local readiness.

BRIEF DESCRIPTION OF THE DRAWINGS

FIG. 1 is an overall cut-away perspective view of a typical toroidal plasma device.

FIG. 2 is a view of a typical toroidal coil of the apparatus of FIG. 1 as seen along the axis of FIG. 1.

FIG. 3 is a sectional side view of the coil of FIG. 2 taken along section lines 3—3.

FIG. 4 is a top view of a toroidal coil of FIG. 1 showing an alternate embodiment of the present invention.

DETAILED DESCRIPTION OF THE INVENTION

FIG. 1 is a cut-away perspective view of a typical toroidal plasma device. In FIG. 1 plasma 10 is substantially toroidal in shape. Plasma 10 is enclosed by container 12 which maintains a region of low pressure. TF coils 14 are wound in a spiral about plasma 10 to generate magnetic fields going substantially along and confining plasma 10. OH coils 16 pass along the major axis of the toroid of plasma 10 so that a changing current passing either up or down through OH coil 16 generates a magnetic field that is coupled to plasma 10 to heat plasma 10. EF coils 18 are circular and carry currents that are either parallel or anti-parallel to the currents in plasma 10. EF coils 18 are adjusted to generate vertical magnetic fields that stabilize the plasma against various kinds of instability that would result without EF coils 18. While the present invention is adaptable to protect any of the coils shown in FIG. 1, it is most useful to protect the EF coils 18 from damage due to fault currents either from turn to turn of EF coil 18 or from EF coil 18 to other portions of the structure in FIG. 1. For this reason the invention will be described in terms of its placement about an EF coil 18.

FIGS. 2 and 3 are respectively a top view and a sectional side view of an EF coil 18 of FIG. 1. FIG. 3 is a sectional view along section lines 3—3 of FIG. 2. FIGS. 2 and 3 also show a sensor 20 that is placed next to and inside EF coil 18 and a second sensor 22 placed next to and outside EF coil 18. Coils such as sensors 20 and 22 are frequently referred to as "B-dot" coils to indicate that they respond to the time derivative of the magnetic flux density B. A single sampling coil 20 or 22 can be used to generate a comparison with a reference voltage in one embodiment of the invention. However, if such a sampling coil were placed in or around EF coil 18, it would respond not only to the flux change produced by changing current flow in EF coil 18 but would also respond to flux changes in the region 24 enclosed by FIG. 2. Since region 24 typically includes the plasma and the omic heating coil, there is enclosed within region 24 a large amount of changing flux that can provide interfering readings on sampling coils placed near EF coils 18. That interference is minimized by a second embodiment of the apparatus of the present invention which comprises forming sensors 20 and 22 of a bifilar wire that is placed so that the two wires 26 and 28 that form sensor 20 develop EMFs due to changes in the enclosed magnetic flux that are opposite and substantially equal. The only flux change to which sensors 20 and 22 thus respond is the change is flux between wires 26 and 28 and their equivalents in sensor 22. The bifilar wire is available commercially and inexpensively. It is easy to attach in a proper position to a coil such as EF coil 18, and it is readily prepared by applying a short circuit at one end and bringing the other end out as twisted leads to control equipment such as a high-impedance voltmeter that will measure the voltage between wires 26 and 28 and that of sensor 22 and subtract the voltages to provide a measure of changes in the flux associated with EF coil 18. An unexpected change in that flux produced by a change in the current in coil 18, can be sensed to provide information about a developing fault and the current to EF coil 18 can be turned off accordingly in response to a signal from the control equipment.

A second alternate embodiment of the present invention is shown in FIG. 4 in which an EF coil 18 has placed near it a number of sensors 30, each formed like sensors 20 and 22 but shortened to span only a portion of the length of EF coil 18. It may be desirable to use similar sensors inside EF coil 18 to obtain a difference voltage. The EMFs obtained from each of the sensors 30 can be monitored independently and used to provide control of the supply of current to EF coil 18 in the event of an unwanted change. In addition, the position of a sensor 30 may provide information about the location of a turn-to-turn short in EF coil 18. Alternatively, the signals from one sensor 30 can be added to that of another sensor 30 to provide the same information as sensor 22 of FIGS. 2 and 3. In the same way sensor 20 of FIG. 2 could be replaced by a number of sections of smaller sampling coils on the inside of EF coil 18 to provide further localization of a turn-to-turn short within EF coil 18. The sensors 20 and 22 could also be connected in series in a direction to cause their induced EMFs to oppose each other. The net voltage as measured by a voltmeter would be zero until there was a change in the current in EF coil 18 due to turn-to turn faults or the like.

The embodiments of the invention in which an exclusive property or privilege is claimed are defined as follows:

1. A sensor for detecting changes in magnetic flux in an equilibrium-field coil in a Tokamak plasma device comprising:

a first bifilar wire disposed inside and parallel to a turn of the equilibrium-field coil in sensing proximity to the equilibrium-field coil;

a short circuit applied at a first end of the first bifilar wire across the wires thereof;

a second bifilar wire disposed outside and parallel to the turn of the equilibrium-field coil in sensing proximity to the equilibrium-field coil;

a short circuit applied at a first end of the second bifilar wire across the wires thereof at a location corresponding to the short circuit at the first end of the first bifilar wire; and control means connected across the wires at a second end of the first bifilar wire and across the wires at a second end of the second bifilar wire to obtain a difference voltage of voltages generated in the first and second bifilar wires, which difference voltage is a measure of change in magnetic flux in the equilibrium-field coil.

2. The apparatus of claim 1 wherein the first and second bifilar wire extend over substantially a full circumference of the equilibrium-field coil.

3. The apparatus of claim 1 wherein the first and second bifilar wires extend over a sector that spans less than the full circumference of the equilibrium-field coil.

4. The apparatus of claims 1, 2, or 3 wherein the second end of the first bifilar wire is connected to the second end of the second bifilar wire to form a single sensor responsive to a difference in voltages generated in the two coils, and wherein the control means comprise a voltmeter connected to the sensor to measure the difference in voltages, which difference in voltages is a measure of the change in flux in the equilibrium-field coil.

* * * * *